United States Patent [19]
Chujo

[11] Patent Number: 5,109,383
[45] Date of Patent: Apr. 28, 1992

[54] SCAN PATH CIRCUIT
[75] Inventor: Naoya Chujo, Aichi, Japan
[73] Assignee: Kabushiki Kaisha Toyota Chuo Kenkyusho, Aichi, Japan
[21] Appl. No.: 401,774
[22] Filed: Sep. 1, 1989
[30] Foreign Application Priority Data
  Sep. 7, 1988 [JP] Japan .................. 63-225173
[51] Int. Cl.[5] .................................. H04B 17/00
[52] U.S. Cl. ............................ 371/22.3; 371/22.5
[58] Field of Search ..................... 371/22.3, 22.5; 324/73.1

[56] References Cited

U.S. PATENT DOCUMENTS

| | | | |
|---|---|---|---|
| 4,799,004 | 1/1989 | Mori | 371/22.3 |
| 4,862,068 | 8/1989 | Kawashima et al. | 371/22.3 |

FOREIGN PATENT DOCUMENTS

| | | | |
|---|---|---|---|
| 0295182 | 11/1989 | Japan | 371/22.3 |
| 0118471 | 5/1990 | Japan | 371/22.3 |

*Primary Examiner*—Jerry Smith
*Assistant Examiner*—Ly V. Hua
*Attorney, Agent, or Firm*—Oblon, Spivak, McClelland, Maier & Neustadt

[57] ABSTRACT

A scan path circuit, to be integrally inserted in an arbitrary place of a logic circuit, for detecting faults of the logic circuit. The scan path circuit includes: a first switch connected to a data-in for receiving data from the logic circuit; a second switch connected to the first switch and to a data-out for sending data to the logic circuit; a third switch connected to the data-out; a first latch connected to a scan-in for inputting testing data and storing the data and connected to the third switch for outputting the data to the logic circuit; and a second latch for inputting and storing the data returned from the logic circuit. The circuit is so constructed that the connection of the latches and the logic circuit is controlled so as to detect faults of the circuit during scanning operation and to directly connect the data-in with the data-out during normal operation.

5 Claims, 10 Drawing Sheets

SCAN PATH CIRCUIT

BACKGROUND OF THE INVENTION

1. Field of the Invention

The present invention is generally directed to a scan path circuit utilized for inspecting an interior of an integrated circuit, and more particularly, to an improvement for expanding an applicable range thereof.

2. Description of the Related Art

In recent years, the technology in the sector of semiconductors has remarkably been developed, wherein an integrating factor of LSIs becomes increasingly large, and circuit elements loaded on the single LSI also increase in number. For this reason, the circuit manufactured on the LSI has a larger scale and more complicated functions than ever before.

When testing such an LSI, direct observation into and control over the LSI interior are difficult, and hence it is a common practice that these operations are effected by inputting input data (test data) and observing output data thereof. Namely, presumption about presence or non-presence of faults is given by checking whether the output data relative to the predetermined test data are normal or not. Where the circuit is large in scale and complicated, however, there arise problems in which an amount of test data required for such testing extremely increases, and the time needed for creating the test data is also increased. The amount of test data is large, and the time taken for testing elongates correspondingly.

To obviate such problems and facilitate the testing on the LSI, a testing circuit unnecessary for a normal operation is added, or the circuit is modified for the testing.

On the other hand, the users become capable of designing the LSIs because of a wide spread of a computer aided design (CAD), such attempts are now made in many ways. In this case, the addition or modification of the circuit for facilitating the testing has to be effected on the part of users. However, the design taking the testing into consideration is quite difficult and requires a work of time. Under such circumstances, it is not easy for the users to provide the designs associated with the testing, which is in turn a drawback to the development of LSIs.

Hence, if there is provided a testing system capable of facilitating the testing and automatically performing the design, efficiencies in design modification, in creation of input data and in testing can be improved, which will increase the merits of utilization thereof.

A first reason why the testing on the LSI is difficult lies in the fact that values of flip-flops incorporated into the circuit are difficult to be directly observed or controlled from outside.

For the purpose of eliminating the foregoing problems, a scan design has heretofore been adopted. An arrangement of the scan design is that the flip-flops as a storage circuit in the integrated circuit are so connected that they are usable as a shift register, and a testing route is specially provided. Based on this scan design, since the flip-flops are employed as the shift register, desired values can be set in the flip-flops, and the values of the flip-flops can be outputted to the outside. Besides, the scan design exhibits an effect in which the circuit design for testablity can automatically be provided.

The description will now deal with a prior art scan path circuit in conjunction with FIG. 13. Referring to FIG. 13, flip-flops 10 and 12 are incorporated into a logic circuit 100. The flip-flops 10 and 12 in the logic circuit 100 are connected in series through switches 14 and 16.

The flip-flops are separated from the logic circuit by changing over the switches 14 and 16, whereby the flip-flops are allowed to function as a shift register.

More specifically, when turning on the switches 14 and 16 in response to mode control signals during the testing, the flip-flops 10 and 12 are connected in series, thus acting as the shift register. Therefore, outputs of the shift register (flip-flops 10 and 12) can be outputted to the outside (scan out) while carrying out a shifting operation in accordance with scan inputs. As a result of this, the values of the flip-flops 10 and 12 can be checked. In addition, the values of the flip-flops incorporated into the circuit can be set to predetermined values by inputting the predetermined values to the shift register (flip-flops 10 and 12) (scan-in) while performing the shifting operation. In this case, the operations of the flip-flops are controlled on the basis of external clock signals in order that the flip-flops 10 and 12 are made to exhibit a function of the shift register.

As above-mentioned, the scan design facilitates the circuit testing in the LSI by observing and controlling the values of the flip-flops as storage elements.

There are, however, caused the following problems inherent in the prior art scan design.

(a) According to the scan design, the flip-flops in the circuit serve as not only an ordinary storage circuit but also a scanning shift register during the testing. For this reason, the flip-flops to which this scan design is applied have to be designed to operate in synchronism with the external clock.

Hence, the scan design can not be applied to a circuit including the flip-flops asynchronous with the signals from the external clock.

(b) The scan design can not be applied to a combinational circuit and to a circuit including a loop circuit which is not in the form of flip-flop, e.g. a loop circuit designed to form a signal line loop by feeding back a part of the signal line.

The circuit including the flip-flops asynchronous with the external clock signals or the circuit including the loop circuit which does not take the form of flip-flop are not peculiar, or rather often employed in the ordinary circuit design. In such circuits, a circuit design for testablity is also required.

A circuit modification has heretofore been effected manually so that the scan design can also be applied to those circuits. The operations of modifying those circuits are performed not by automatic conversion but by hands. Therefore, where the scan design is applied to those circuits, the merits are very small.

Furthermore, the circuits to which the scan design is allowed to be applied are attended with the following problems.

That is, the ordinary flip-flops can be converted into flip-flops dedicated to scanning and having a shift function by use of an automatic conversion system. However, a scanning flip-flop circuit having the shift function and a storage function as well is typically quite complicated in structure. Therefore, an additional problem is that a normal operation is delayed as compared with the flip-flops invested with no scan function.

SUMMARY OF THE INVENTION

It is a primary object of the present invention, which is made to obviate the foregoing problems, to provide a scan path circuit applicable to a logic circuit employing flip-flops asynchronous with an external clock and also a logic circuit using no flip-flop.

In the conventional scan design, as discussed above, scan-in and scan-out are effected to flip-flops. This turns out to be a cause for the above-described restrictions in terms of applicability of the scan design.

The flip-flops may be conceived as a storage circuit in which logic elements are looped together. The present inventor paid attention to this point and the assumption is as follows. Namely, the flip-flops are conceived as a loop circuit, and the loop is separated midway during the testing. If signal values at both ends of the separated loop are arranged to be observable and controllable, the testing on the logic circuit can readily be executed. Besides, the restrictions of applicability of the scan design are eliminated.

It is required that the following functions be imparted to the scan path circuit for observing and controlling the signal values at both ends of the separated signal line of the logic circuit:

(a) A function to exert no influence on a flow of signal values while being equivalent to a mere signal line during a normal operation;

(b) A function to observe the signal values on the signal line and store these values during a scan operation;

(c) A function to set the signal values on the signal line to predetermined values during the scan operation; and (d) A function to take the signal values inputted from outside into the scan path circuit by a shift operation and to feed out the signal values stored in the scan path circuit to outside by the shift operation when providing one route by connecting the scan path circuits to each other.

To accomplish the foregoing object, according to the present invention, there is provided a scan path circuit to be integrally inserted into an arbitrary place of a logic circuit e.g. in an IC, which comprises: latch means for outputting testing data to the logic circuit and receiving the data returned from the logic circuit; and switch means connected to the latch means, for transmitting the testing data from the latch means to the logic circuit, and transmitting the returned data from the logic circuit to the latch means for scanning operation, and for directly connecting data-in with data-out of the logic circuit for normal operation, by controlling the connection of the latch means and logic circuit, thereby easily detecting faults of the logic circuit based on the data outputted from the latch means.

The latch means may be connected to a scan-in for inputting the testing data and to a scan-out for outputting the returned data, and the switch means may have control signals for scanning and normal operations and may be connected to a data-in for receiving data from the logic circuit and to a data-out for feeding out data to the logic circuit, thereby easily detecting faults of the logic circuit based on the data outputted from the scan-out.

Further, according to one aspect of the invention as illustrated in FIG. 1, the scan path circuit comprises: a first switch SW1 having one end connected to a data-in Din for receiving data from a logic circuit; a second switch SW2 having one end connected to the other end of the first switch SW1 and the other end connected to a data-out Dout for feeding out the data to the logic circuit; a third switch SW3 having one end connected to the data-out Dout; a first latch L1, having an input terminal connected to a scan-in Sin, for inputting testing data and storing the data in accordance with a predetermined control signal PHIA and having an output terminal connected to the third switch for outputting the data to the logic circuit; and a second latch L2, having an input terminal connected to a connecting point between the first switch SW1 and the second switch SW2 and an output terminal connected to a scan-out Sout, for inputting the data from the data-in and storing the data in accordance with a predetermined control signal PHIB.

In accordance with one aspect of the present invention, three pieces of switches SW1, SW2 and SW3 are organically combined with two pieces of latches L1 and L2, thereby making it possible to effect desired scan and shift operations and to observe and set signal values in desired positions within the logic circuit.

The scan path circuit according to the invention has the above-mentioned construction and operates as below.

To be specific, the scan path circuit is possessed of the following three modes which will hereinafter be described.

(a) Normal mode:

The third switch SW3 is turned off, whereas the first and second switches SW1 and SW2 are turned on. With this arrangement, the signals transmitted from the data-in Din are outputted directly to the data-out Dout. That is, during the normal operation, a span from the data-in Din to the data-out Dout is logically equivalent to a single signal line.

(b) Scan mode:

The switch SW2 is turned off, whereas the other switches SW1 and SW3 are turned on. Upon a change from 1 to 0 of the control signal PHIB of the latch L2, the signal values of the data-in Din connected to one end of the signal line of the logic circuit are stored via the switch SW1 in the latch L2. The signal values stored in the latch L1 are outputted via the switch SW3 to the data-out Dout, and the signal values of the logic circuit are set to these values.

(c) Shift mode:

The switch SW1 is turned off, whereas the other switches SW2 and SW3 are turned on. Upon a change from 1 to 0 of the control signal PHIA in this state, the signal values of a scan-in Sin are stored in the latch L1. When a change from 1 to 0 of the control signal PHIB takes place thereafter, the output values of the latch L1 are stored via the switches SW3 and SW2 in the latch L2 and then outputted from a scan-out Sout. In this way, the shift of the signal values stored in the latches L1 and L2 is attained.

The next description will be focused on the testing which involves a step of incorporating the scan path circuit of the invention into the logic circuit.

A logic circuit signal line in which the signal values are to be observed and controlled is disconnected. The data-in Din of the scan path circuit is connected to an input of the thus disconnected part, while the data-out Dout to an output thereof.

During the normal operation, the above-mentioned normal mode is set, whereby the scan path circuit is logically equivalent to mere signal lines so as to exert no influence on the logic circuit.

On the occasion of the testing, the scan path circuit is made to perform the shift operation, and the signal values set in the signal line to be tested are taken in the scan path circuit. Subsequently, scanning is effected, and the signal values taken in are outputted from the data-out Dout. These signal values are given to the signal line of the logic circuit. Predetermined signal values are also set in other inputs of the logic circuit to be tested.

Then, signal values of a target signal line for the testing are determined by circuit operations. These signal values are taken in from the data-in Din and are stored in the scan path circuit, at which time the output values of the logic circuit are to be observed. The subsequent step is to output the signal values taken in the scan path circuit from the scan-out Sout by causing the scan path circuit to effect the shift operation. The signal values of the scan-out Sout and other signal values of the logic circuit output line are compared with expected values which have previously been calculated, thus checking the logic circuit to seek faults.

In accordance with the scan path circuit of the invention, the testing can be effected on circuits other than the circuit including the flip-flop which, as in the prior art scan path circuit, synchronizes with the external clock. The testing can also be carried out by inserting the scan path circuit in an arbitrary place of the logic circuit.

It is therefore possible to easily check whether or not the faults are present in such circuits that the testing is hard to be done because of the difficulty to observe and control the signal values within the logic circuit. The circuitry for incorporating the scan path circuit according to the present invention is readily provided, and the effects in terms of design are considerably large.

BRIEF DESCRIPTION OF THE DRAWINGS

Above and other objects and features of the present invention will become apparent from the discussion taken in conjunction with the accompanying drawings, in which.

DESCRIPTION OF THE PREFERRED EMBODIMENTS

Illustrative embodiments of a scan path circuit according to the present invention will hereinafter be described with reference to the accompanying drawings.

First Embodiment

A first embodiment of the present invention will be explained referring to FIGS. 2 to 4.

Figure 1:
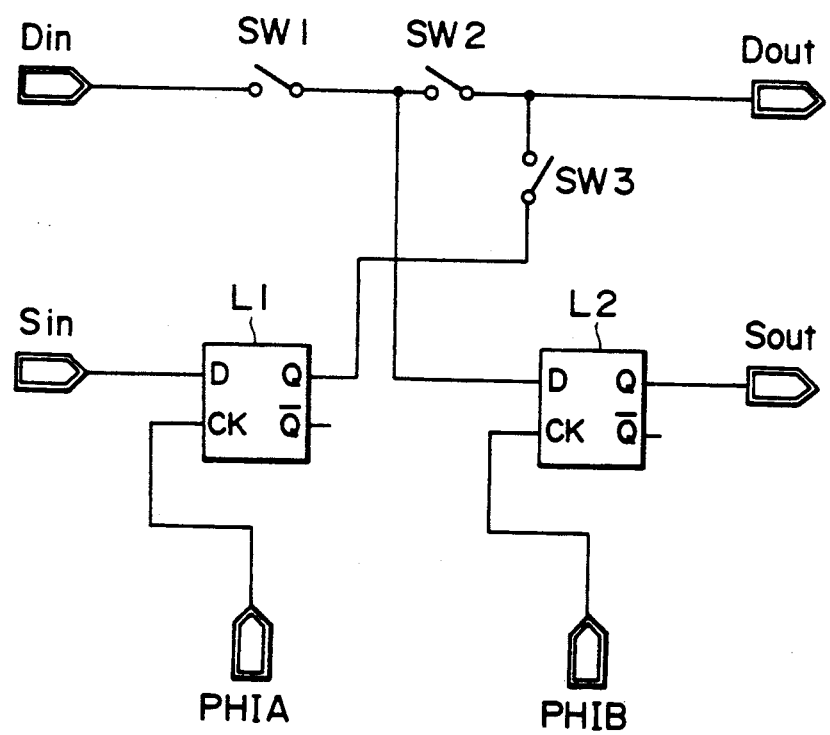
FIG. 1 is a block diagram showing a scan path circuit according to the present invention.
Figure 2:
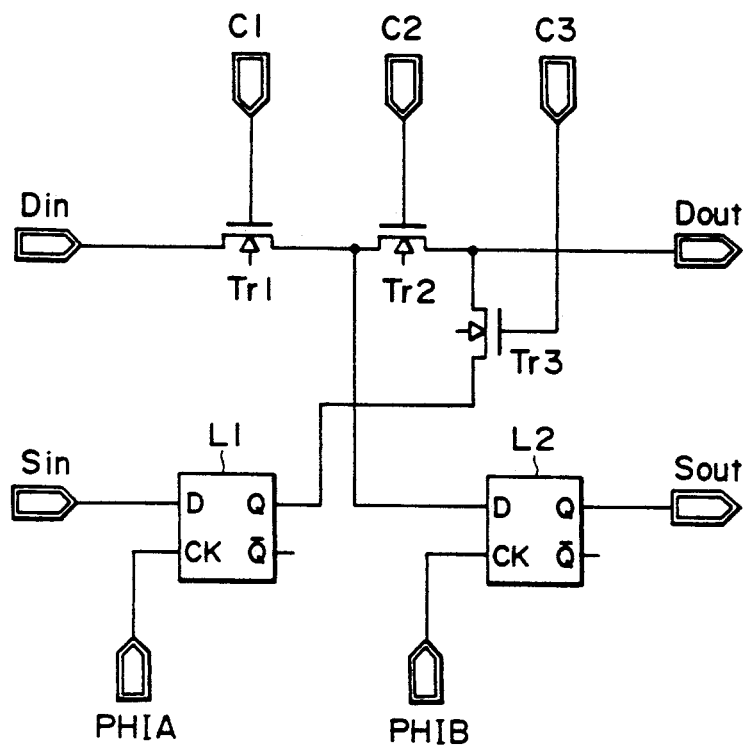
FIG. 2 is a block diagram showing the circuit of a first embodiment of the invention.

In the first embodiment, as shown in FIG. 2, first to third switches involve the use of MOS transistors Tr1, Tr2 and Tr3. More specifically, two MOS transistor switches Tr1 and Tr2 are connected in series, and both ends thereof are connected to a data-in Din and a data-out Dout, respectively. An output pin Q of a latch L1 is connected through the switch Tr3 to the data-out Dout. The utilization of such MOS transistors permits accurate switching and facilitates the manufacture of scan path cirsuits.

Two latches L1 and L2 are provided separately from the above-mentioned. The first latch L1 has an input pin D connected to a scan-in Sin and an output pin Q connected to one end of the switch Tr3 of the third MOS transistor. The other end of the switch Tr3 is connected to a data-out Dout.

On the other hand, the second latch L2 has an input pin D connected to a point between the switches Tr1 and Tr2 and an output pin Q connected to a scan-out Sout. Inputted to gate terminals of the switches Tr1 through Tr3 are control signals C1, C2 and C3, respectively.

Figure 3:
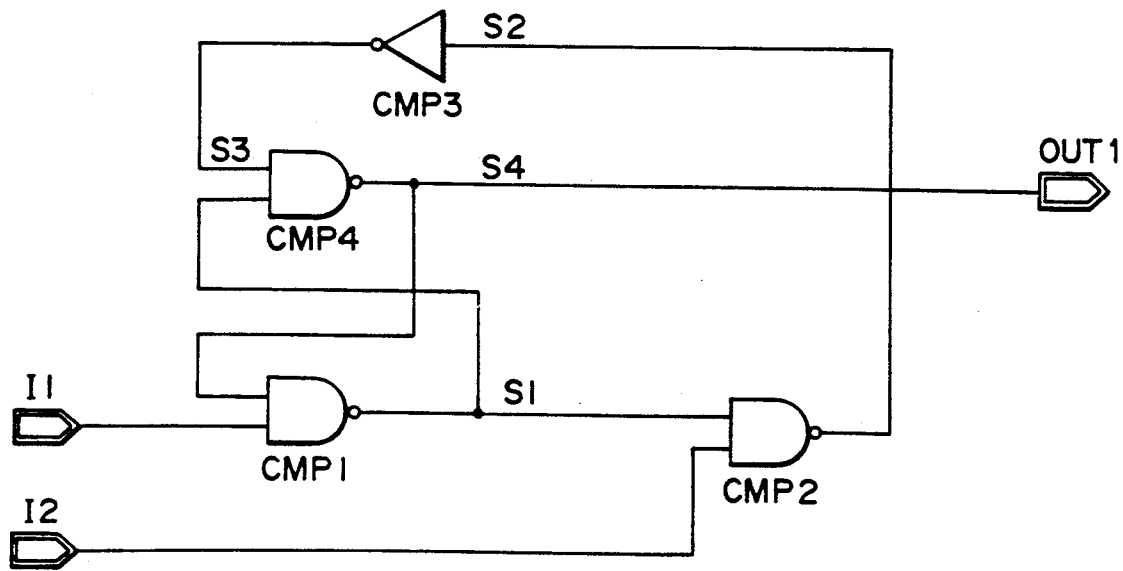
FIG. 3 is a block diagram showing an example of a circuit including asynchronous flip-flops.

Turning next to FIG. 3, there is illustrated one example of a logic circuit to which the scan path circuit of the invention is applied, wherein the circuit includes an asynchronous flip-flop. The logic circuit functions to receive two input signals I1 and I2 and to output an output OUT in a constant state. The flip-flop comprises four pieces of logic elements, i.e., three NAND circuits CMP1, CMP2 and CMP4 and one inverter CMP3.

The input signal I1 is inputted to one end of the NAND circuit CMP1. The input signal I2 and the output signal S1 of the NAND circuit CMP1 are inputted to the NAND circuit CMP2. The output signal S2 of the NAND circuit CMP2 is inputted as an output signal S3 to the NAND circuit CMP4 after being inverted by the inverter CMP3.

The output signal S1 of the NAND circuit CMP1 is also inputted to the NAND circuit CMP4. An output signal S4 of the NAND circuit CMP4 is outputted as an output signal OUT1. The output signal S4 is inputted to the other end of the NAND circuit CMP1. Hence, a state of the output signal OUT1 is determined depending on conditions of the input signals I1 and I2.

Figure 4:
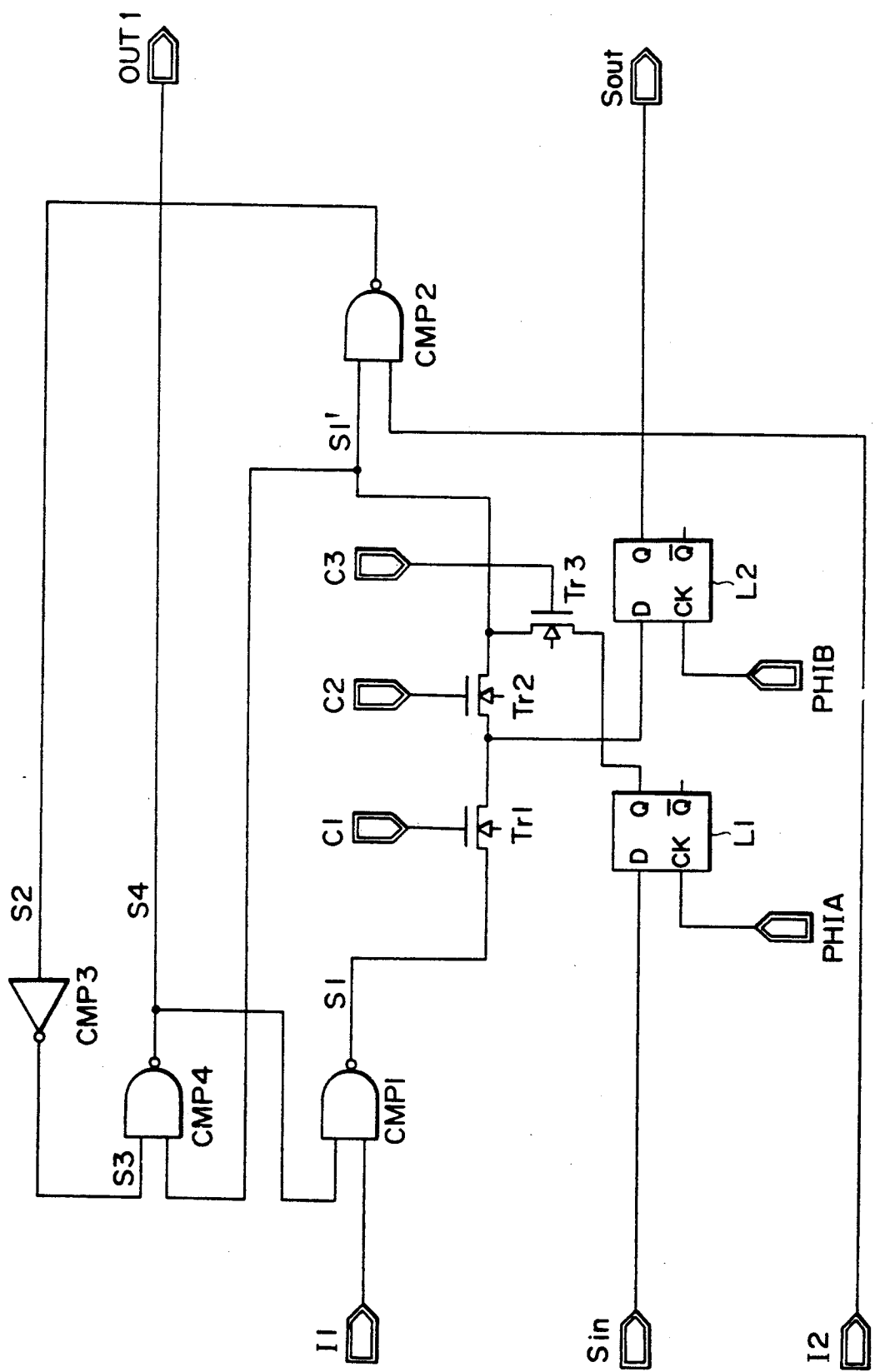
FIG. 4 is a block diagram showing an example of a circuit incorporating the scan path circuit of the first embodiment.

FIG. 4 shows a circuit incorporating the scan path circuit of the invention for checking the logic circuit including the above-described asynchronous flip-flop. In this example, the scan path circuit is interposed between an output pin of the NAND circuit CMP1 and input pins of the NAND circuits CMP2 and CMP4.

Therefore, the output signal S1 of the NAND circuit CMP1 is inputted via the scan path circuit to the NAND circuits CMP2 and CMP4 as a signal S1'.

Next, the operation in the circuit depicted in FIG. 4 will be described.

In the case of the normal operation, control signals C1, C2 and C3 are set to C1=1, C2=1 and C3=0, respectively. The switches Tr1 and Tr2 are turned on, while the switch Tr3 is turned off. In this state, the signal S1 transmitted from the NAND circuit CMP1 is inputted via the switches Tr1 and Tr2 directly to the NAND circuit CMP2. Namely, this circuit under such a condition is logically equivalent to a signal line which connects the NAND circuit CMP1 to the NAND circuit CMP2.

The scan operation will next be explained. The control signals C1, C2 and C3 are set to C1=1, C2=0 and C3=1, respectively. The switches Tr1 and Tr3 are turned on, whereas the switch Tr2 is turned off. When varying the operation control signal PHIB of the latch L2 from 1 to 0 in this state, a signal value of a data-in Din is stored through the switch Tr1 in the latch L2 at a trailing edge thereof. A control signal PHIA of the latch L1 is changed from 1 to 0, with the result that the signal value of the latch L1 is outputted via the switch Tr3 to a data-out Dout at the trailing edge. The signal values of the logic circuit are thus stored in the scan path circuit, while the signal values of the scan path circuit are fed to the logic circuit.

The description will now deal with the shift operation to output set values stored in the latches L1 and L2 and to set predetermined values in the latches L1 and L2. In the case of the shift operation, the control signals C1, C2 and C3 are set to C1=0, C2=1 and C3=1.

The switches Tr2 and Tr3 are turned on, whereas the switch Tr1 is turned off. Upon a change of the control signal PHIA of the latch L1 from 1 to 0 in this state, a signal value of a scan-in Sin is stored in the latch L1 at the trailing edge. Thereafter, when changing the control signal PHIB of the latch L2 from 1 to 0, an output value of the latch L1 is stored by way of the switches Tr3 and Tr2 in the latch L2 and is then outputted to the scan-out Sout. Based on this function, the switches Tr2 and Tr3 are thus turned on, while the switch Tr1 is turned off. Under this condition, the signal values stored in the latches L1 and L2 are sequentially outputted from the scan-out Sout.

If a plurality of scan path circuits of the invention are connected in series, the signal values stored therein are sequentially outputted.

Where predetermined signals are sequentially inputted from the scan-in Sin, the predetermined values can be inputted to the latches L1 and L2 of each scan path circuit.

The description about the testing on the circuit shown in FIG. 4 will be given as follows.

To start with, the explanation of a checking method is made on the assumption that there is caused a fault that a value of the signal S1 is fixed to 1 in this circuit.

Preparatory to this testing, it is necessary to set the input signal so that the signal S1 becomes 0, and to set signal values so that the corresponding output signal can be observed from the outside of the circuit.

Now, the input signal I1 is set to 1.

Then, the scan-in signal Sin is set to 0 in order that the signal S1' is set to 0, and thereafter the shift operation is performed. To be specific, the control signal PHIA is changed from 1 to 0 in a state where the respective switch control signals C1, C2 and C3 are set to C1=0, C2=1 and C3=1. As a result, the signal value of the scan-in signal Sin is taken in the latch L1. Then, the value 0 is outputted as the signal S1'.

After being outputted as the signal S1', the signal value 0 is inputted to one end of the NAND circuit CMP4. When one input pin of the NAND circuit CMP4 has been supplied with the value 0, an output signal S4 thereof becomes 1. Therefore, it follows that signals of 1 are inputted as the input signal I1 and signal S4 to two input pins of the NAND circuit CMP1. If the NAND circuit CMP1 normally functions, the output signal S1 has to become 0.

To observe the output signal S1 of the NAND circuit CMP1, the following scan operation is executed. To begin with, the control signals of the switches Tr1, Tr2 and Tr3 are set to C1=1, C2=0 and C3=1. The control signal PHIB of the latch L2 is varied from 1 to 0, as a result of which the output signal S1 of the NAND circuit CMP1 is taken in the latch L2 by way of the switch Tr1. Then, the output signal S1 is outputted to the scan-out Sout.

It is possible to check such a fault that the signal S1 is fixed to 1 by observing the signal value of the scan-out Sout. That is, if the signal value of the signal S1 is 0, this implies a normal state. Whereas if the value is 1, this implies a fault.

The explanation will hereinafter be given on the assumption that another fault where a signal value of the signal S4 is fixed to 1 takes place.

In this case, a necessary signal value is set so that the output of the NAND circuit CMP4 becomes 0. With this arrangement, the value of the signal S4 can be observed as an output signal OUT.

For this purpose, the input signal I2 is at first set to 1. Subsequently, the signal value of the scan-in Sin becomes 1 in order to set the signal S1' to 1. The shift operation is thus performed. Specifically, the switch Tr1 is turned off, while the switches Tr2 and Tr3 are turned on. The control signal PHIA of the latch L1 is changed from 1 to 0. In consequence of this, the signal value of the scan-in Sin is taken in the latch L1, and this signal value 1 is outputted in the form of the signal S1' through the switch Tr3. In other words, the signal S1' is set to 1.

Where the Signal S1' is set to 1 in this manner and the input signal I2 is set to 1, an output signal S2 of the NAND circuit CMP2 becomes 0. The signal S2 is inverted by means of the inverter CMP3, while a signal S3 is supplied as a value 1 to the NAND circuit CMP4. On the other hand, the value 1 is supplied as the signal S1' to the other input pin of the NAND circuit CMP4, and hence the output of the NAND circuit CMP4 has to be 0.

The signal value of the output signal OUT1 is observed in this state. If the signal value is 0, this indicates a normal state. Whereas if the value is 1, this indicates a fault.

Second Embodiment

A second embodiment of the scan path circuit according to the present invention will be explained referring to FIGS. 5 and 6.

Figure 5:
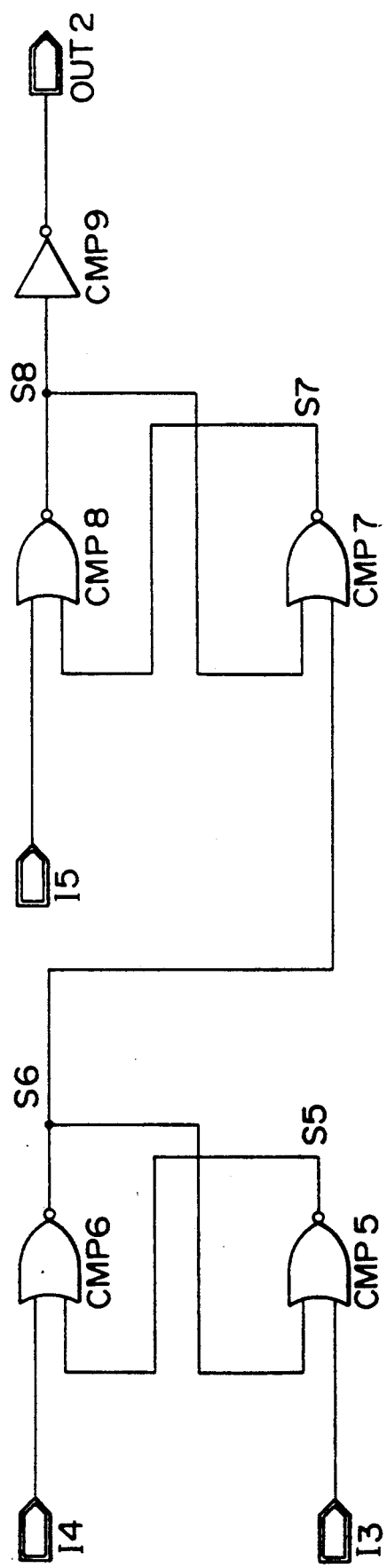
FIG. 5 is a block diagram showing an example of a circuit comprising two flip-flops.

FIG. 5 shows an example of a logic circuit to which scan path circuits of the invention are applied, wherein the circuit includes two asynchronous flip-flops. The logic circuit functions to receive three input signals I3, I4 and I5 and to output an output OUT2. The circuit comprises five pieces of logic elements, i.e., four NOR circuits CMP5, CMP6, CMP7 and CMP8 and one inverter CMP9.

The flip-flop was composed of two NOR circuits CMP5 and CMP6. The NOR circuit CMP5 receives two inputs signals I3 and S6 and outputs an output signal S5, and the NOR circuit CMP6 receives two inputs signals I4 and S5 and outputs an output signal S6. The other flip-flop was composed of two NOR circuits CMP7 and CMP8. The NOR circuit CMP7 receives two input signals S6 and S8 and outputs an output signal S7, and the NOR circuit CMP8 receives two input signals I5 and S7 and outputs an output signal S8. The inverter CMP9 receives an input signal S8 and outputs an output signal OUT2.

Figure 6:
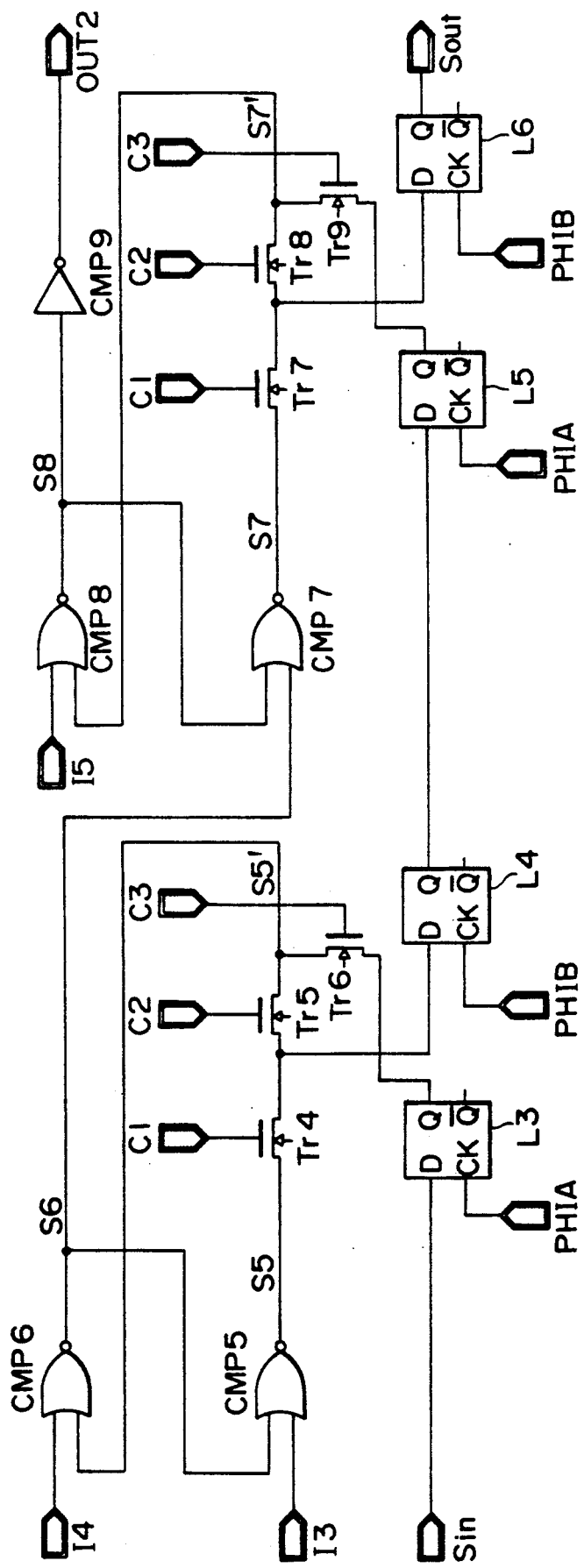
FIG. 6 is a block diagram showing an example of a circuit comprising two flip-flops and two scan path circuits of the second embodiment.

FIG. 6 shows a circuit incorporating the scan path circuits of the invention for checking the logic circuit including the above-described two asynchronous flip-flops. In this example, the first scan path circuit is interposed between the output pin of the NOR circuit CMP5 and the input pin of the NOR circuit CMP6, and the second scan path circuit interposed between the output pin of the NOR circuit CMP7 and the input pin of the NOR circuit CMP8. Further, the scan-out Sout of the first scan path circuit is connected to the scan-in Sin of the second scan path circuit, resulting in a single scan path line.

Next, the operation of the circuit shown in FIG. 6 will be described.

For normal operation, control signals C1, C2 and C3 of switches are set to C1=1, C2=1 and C3=0. The operations thereof are similar to those of the first embodiment. The output signal S5 of the NOR circuit CMP5 is inputted to the NOR circuit CMP6 as a signal S5' through the scan path circuit. The output signal S7 of the NOR circuit CMP7 is inputted to the NOR circuit CMP8 as a signal S7' through the scan path circuit. The switches Tr4 and Tr5 are turned on, while the switch Tr6 is turned off. In this state, the output signal S5 of the NOR circuit CMP5 is inputted directly to the NOR circuit CMP6 through the switches Tr4 and Tr5. In the same way, the switches Tr7 and Tr8 are turned on, while the switch Tr9 is turned off. In this state, the output signal transmitted from the NOR circuit CMP7 is inputted directly to the NOR circuit CMP8 through the switches Tr7 and Tr8. Namely, this circuit under such a condition is logically equivalent to the signal lines which connect the NOR circuit CMP5 to the NOR circuit CMP6 and connect the NOR circuit CMP7 to the NOR circuit CMP8.

The testing of the logic circuit with the invented scan path circuit is explained, assuming that the logic circuit has defects that the value of the signal line S5 is fixed to 0 and the value of the signal line S7 is fixed to 1.

This testing is excuted by way of the following three steps.

1. The shift operation is performed so that a necessary signal value is set to the scan path circuit.
2. In order to test the signal lines S5 and S7, the input signal is set so that the signal values of S5 and S7 could be 1 and 0, respectively. Then the actual signal values of S5 and S7 are stored in the scan path circuit.
3. The shift operation is performed so that the values of S5 and S7 stored in the scan path circuit could be observable.

In the step 1, a value is given to the output signal line of the scan path circuit by the shift operation. The operation that the values 0 are set to the signal lines S5' and S7' by shifting the signal value from Sin is as follows.

The control signals C1, C2 and C3 are set to C1=0, C2=1 and C3=1 for the shift operation in the scan path circuit. The signal line Sin is set to 0, and the control signal PHIA of latches L3 and L5 is set to 0, 1, 0, in turn. The signal value 0 of the signal line Sin is stored at the latch L3, and transmitted to the output Q. Further, the other control signal PHIB of latches L4 and L7 is set to 0, 1, 0, in turn. The signal value 0 of the latch L3 is stored at the latch L4 by way of the switches Tr6 and Tr5, and the signal value 0 of Sin is transmitted to the output Q of the latch L4.

Once again, the value 0 is set to the signal line Sin, and the values 0, 1, 0, are set to the control signal PHIA, in turn. Then, the signal value 0 of the signal line Sin is stored at the latch L3, and transmitted to the output Q of the latch L3. The value 0 is set to the signal line S5' by way of the switch Tr6. At the same time, the value 0 of the output Q of the latch L4 is stored in the latch L5 of the second scan path circuit, and the value 0 is transmitted to the output Q of the latch L5. The value 0 is set to the signal line S7' by way of the switch Tr9.

In the step 2, the circuit is tested by the scan mode of the scan path circuit. To start with, input signals I3, I4 and I5 are set to I3=0, I4=1 and I5=0, respectively. Next, the control signals C1, C2 and C3 are set to C1=1, C2=0, and C3=1. Because the value of one input signal I4 of CMP6 is 1 and the other input signal S5' is 0 by the above setting, the value of the output signal S6 is resulted to be 0. Then, the values 0 are given to the input signals S6 and I3 of CMP5. This will make the value of the output signal S5 of CMP5 to be 1, if there are no defects in the circuits under testing. On the other hand, the input signal value I5 and S7' of CMP8 are 0s. This causes the output value S8 of CMP8 to be 1. Since the value of one input signal I4 of CMP7 is 1 and the value of the other input signal thereof is 0, the output signal S7 of CMP7 be 0 in case of no defects in the logic circuit under testing. Then, the vaiues 0, 1, 0, are set to the control signal PHIB of the latch L4, in turn. The valve of the signal line S5 is stored at L4 by way of Tr4 and transmitted to the output Q of L4. The value of the signal line S7 is stored at L6 by way of the switch Tr7 and transmitted to the output Q of L6. Consequently, the signal line S7 is tested by checking the signal value Sout, because the output Q of L6 is connected to Sout. S7 is found to be normal if the value of Sout is 0 and S7 is found to be abnormal if the value of Sout is 1.

In the step 3, the value of the signal value S5 stored at L4 is made observable by another shift operation. The control signals C1, C2 and C3 are set to C1=1, C2=1 and C3=1 for the shift operation of the scan path circuit. Then, the values 0, 1, 0 are set to PHIA of L5, in turn. This causes the signal value S5 stored at L4 to be memorized at L5. The values 0, 1, 0 are, furthermore, set to PHIB of L6, in turn. This causes the value 0 of S5 stored at L5 to be memorized at L6 by way of Tr9 and Tr8 and to be transmitted to the output Q of L6.

Consequently, the signal line S5 is tested by checking the signal value Sout, because the output Q of L6 is connected to Sout.

S5 is found to be normal if the value of Sout is 1 and S5 is found to be abnormal if the value of Sout is 0.

Third Embodiment

A third embodiment of the scan path circuit according to the present invention will hereinafter be described in connection with FIGS. 7 to 9.

Figure 7:
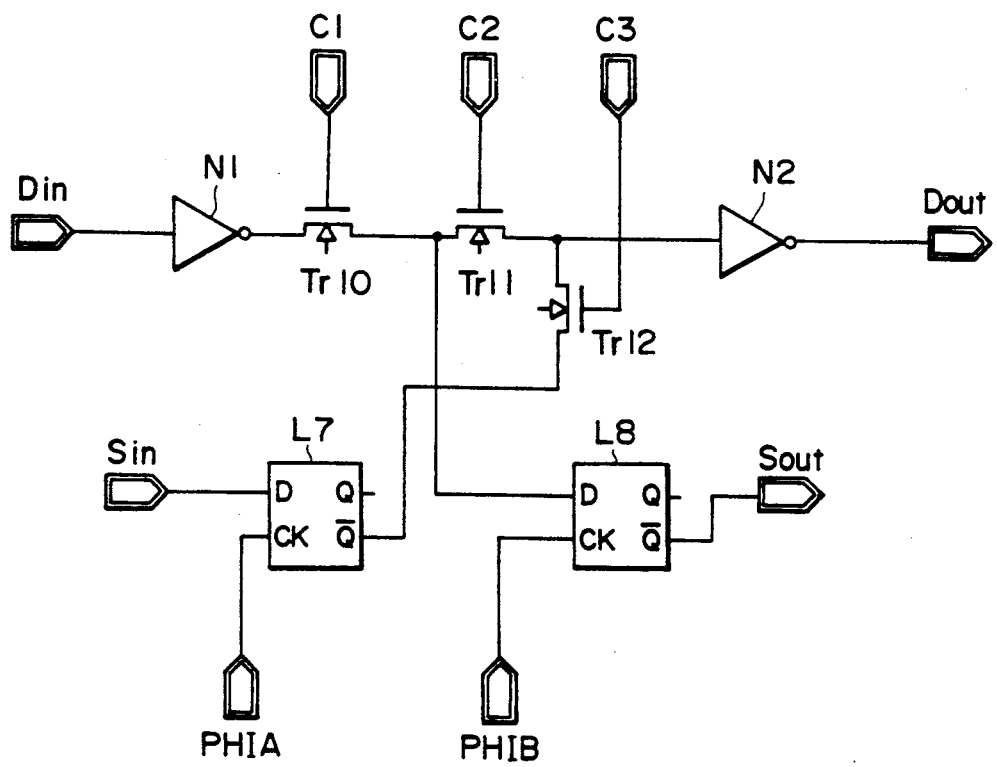
FIG. 7 is a block diagram showing a circuit of a third embodiment.

A characteristic arrangement of the third embodiment is that there are provided two inverters N1 and N2, as shown in FIG. 7.

The inverter N1 is interposed between the data-in Din and the switch Tr10, while the inverter N2 is interposed between the switch Tr11 and the data-out Dout. The inverters N1 and N2 interposed therebetween permit signal amplification. When inputting a signal passing through a long stretch of signal line to the Data-in Din, or when connecting a long signal line or a good number of elements to the top end of the data-out Dout, the operation can be effected at a high speed. In the third embodiment, inverted outputs Q are employed as outputs of the latches L7 and L8. Other constitutions than the above-mentioned are the same as those in the first embodiment, and the operations thereof are also identical.

Figure 8:
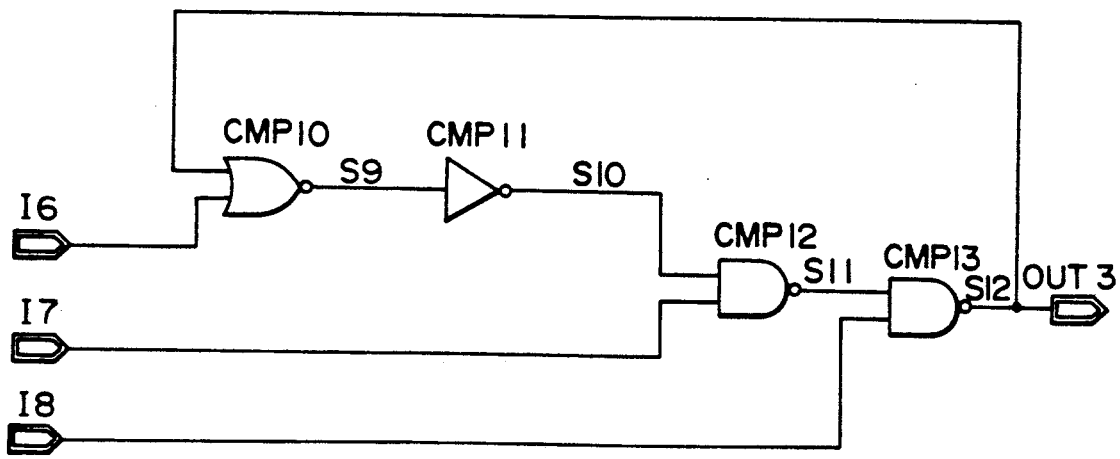
FIG. 8 is a block diagram showing an example of a circuit including a loop which is not in the form of flip-flops.

FIG. 8 shows a circuit including a loop which does not take the form of flip-flop. The input signal I6 is inputted to one end of a NOR circuit CMP10. The output signal S9 of the NOR circuit CMP10 is inputted via the inverter CMP11 to one input pin of the NAND circuit CMP12. The input signal I7 is inputted to the other input pin of the NAND circuit CMP12. Inputted to one input pin of the NAND circuit CMP13 is the output signal S11 of the NAND circuit CMP12. An input signal I11 is inputted to the other input pin of the NAND circuit CMP13. An output signal S12 of the NAND circuit CMP13 is outputted as an output signal and at the same time inputted to the other input pin of the NOR circuit CMP10.

The prior art scan design aiming at the flip-flop can not be applied to this circuit. The scan path circuit of the invention can, however, be applied preferably to a circuit including a loop which is not classified as the foregoing flip-flop.

Figure 9:
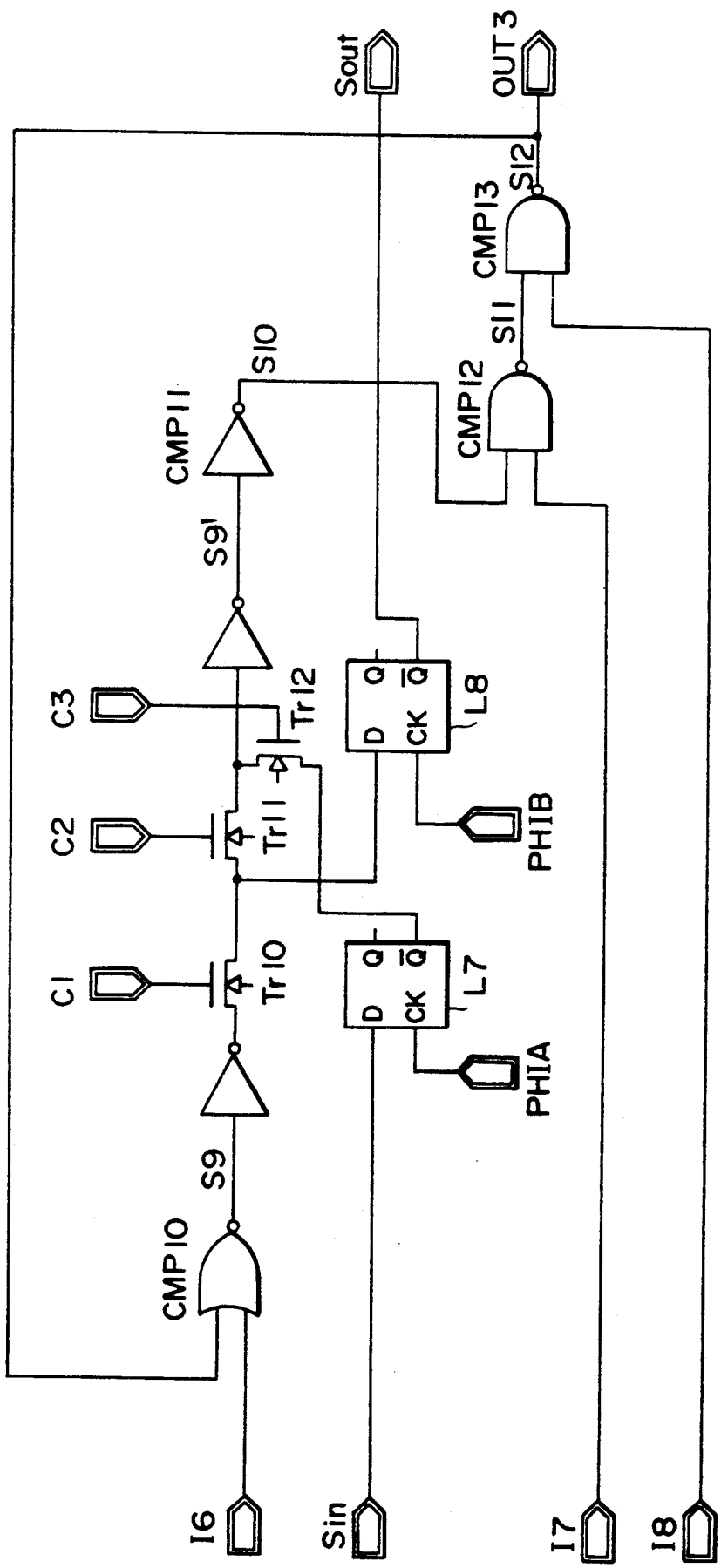
FIG. 9 is a block diagram showing an example of a circuit incorporating the scan path circuit of the third embodiment.

FIG. 9 shows an example where the scan path circuit shown in FIG. 7 is incorporated into the circuit of FIG. 8. In this example, the scan path circuit is interposed between the NOR circuit CMP10 and the inverter CMP11. Based on this construction, the output signal S9 of the NOR circuit CMP10 is inputted by way of the scan path circuit to the inverter CMP11, as a signal S9'. Note that an output pin Q is used as an output pin of the latch in this example.

A checking method will now be described on the assumption that there is caused a fault in which a signal value of the signal S9 of the circuit shown in FIG. 9 is fixed to 0.

The output of the NOR circuit CMP10 is set to 1, and a necessary signal value is so set that the signal value of the signal S9 at that time is observable from outside. Input signals I6, I7 and I8 are set to I6=0, I7=0 and I8=1. Since the NAND circuit CMP12 is supplied with 0 as the input signal I7, a value of the output signal S11 becomes 1. Both of the inputs of the NAND circuit CMP13 become 1, and the output signal S12 thereof becomes 1. Hence, both of the input signals of the NOR circuit CMP10 are 0, and the output signal S9 thereof is set to 1.

In the second place, the scan operation similar to that in the first embodiment is performed to get a value of S9. The signal value S9 of the scan-in Sin is set to 1, with the switch Tr10 being turned off, and the switches Tr11 and Tr12 being turned on. The shift operation carried out in this state causes a value 1 to be outputted as a signal S9'. Subsequently, the switches Tr10 and Tr12 are turned on, while the switch Tr11 is turned off, in which state the scan operation is performed. As a result, the output signal S9 of the NOR circuit CMP10 is taken in the latch L8, whereby the signal S9 can be outputted to the scan-out Sout. A fault of S9 can therefore be detected by observing the signal value in the scan-out Sout. Namely, if the signal value of S9 is 1, this indicates a normal state. In contrast, if the value is 0, this implies presence of a fault.

The following description explains the checking method of a fault that the value of the signal S11 is fixed to 1.

The input signals I7 and I8 should be set to 1 so that the signal S11 could be 0.

Next, the signal of the scan-in Sin is set to 0 in order that the signal S9' is set to 0. Then, the shift operation similar to that in the first embodiment is executed. Consequently, a value 0 of the signal of the scan-in Sin is taken in the latch L1, and the signal value 0 is outputted as the signal S9'.

For this reason, a value of the output signal S10 of the inverter CMP11 becomes 1, and an output value of the NAND circuit CMP13 is 0.

Therefore, a fault in the NAND circuit CMP12 can be detected by observing the output signal S12 of the NAND circuit CMP13 on an signal line OUT3. Namely, if the signal value of the output signal OUT3 is 1, this indicates a normal state. Whereas if the value is 0, this implies presence of a fault.

Fourth Embodiment

A fourth embodiment of the scan path circuit of the invention will be described with reference to FIGS. 10 to 12.

Figure 10:
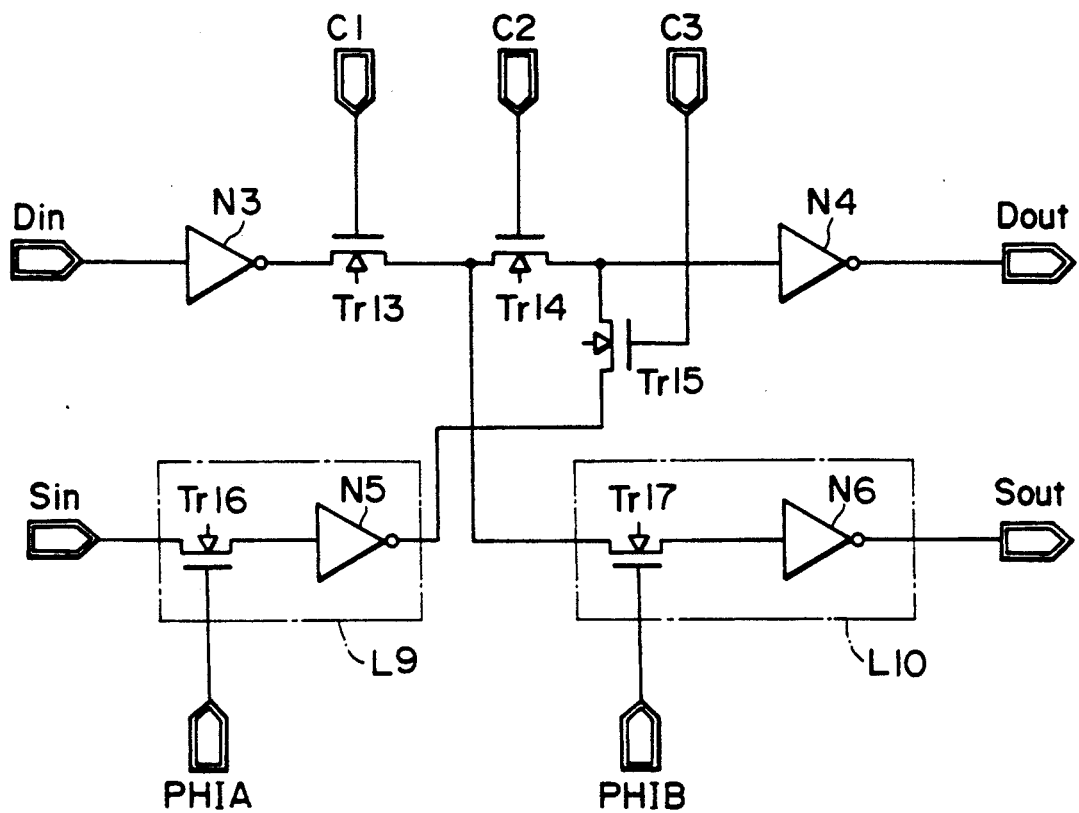
FIG. 10 is a block diagram showing a circuit of a fourth embodiment.

In the fourth embodiment, as illustrated in FIG. 10, the latches L9 and L10 may be defined as dynamic storage circuits consisting of switches Tr16 and Tr17 of MOS transistors and inverters N5 and N6. Each latch is thus composed of the dynamic storage circuit. Based on this construction, an increment in the number of elements, which in needed for facilitating the testing on the circuit, can be restrained. It is to be noted that components other than the latches in the fourth embodiment are the same as those in the third embodiment.

Figure 11:
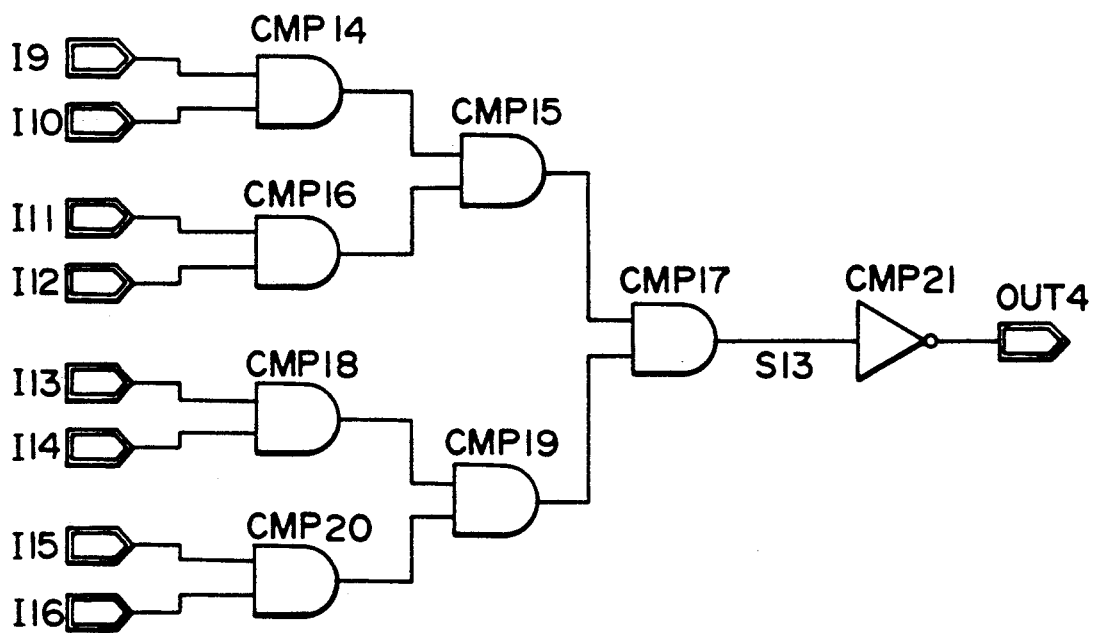
FIG. 11 is a block diagram showing one example of a combinatinal circuit.

FIG. 11 shows one example of a combinational circuit including no loop. The combinational circuit has eight input signals I9 through I16. The input signals I9 and I10 are inputted to an AND circuit CMP14; the signals I11 and I12 to an AND circuit CMP16; the signals I13 and I14 to an AND circuit CMP18; and the signals I15 and I16 to an AND circuit CMP20. The outputs of the AND circuits CMP14 and CMP16 are inputted to the AND circuit CMP15, while the outputs of the AND circuits CMP18 and CMP20 are inputted to the AND circuit CMP19. The outputs of the AND circuits CMP15 and CMP19 are inputted to the AND circuit CMP17, and the output signal S13 thereof is outputted as a value 1 through an inverter CMP21. The combinational circuit is constructed such that the AND circuits are arranged at three stages. The prior art scan path circuit based on the flip-flop can not be applied to the thus constructed circuit. The scan path circuit of the invention can, however, be applied to even such a combinational circuit.

Figure 12:
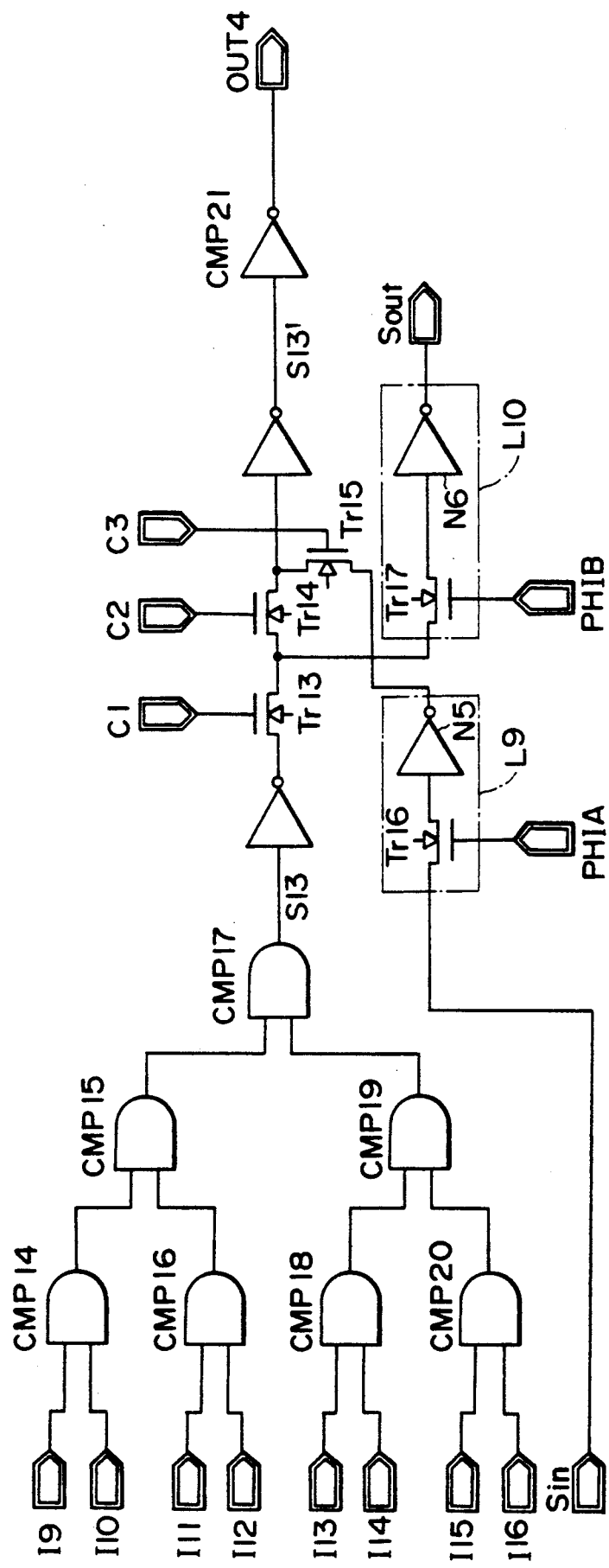
FIG. 12 is a block diagram showing an example of a circuit incorporating the scan path circuit of the fourth embodiment.
Figure 13:
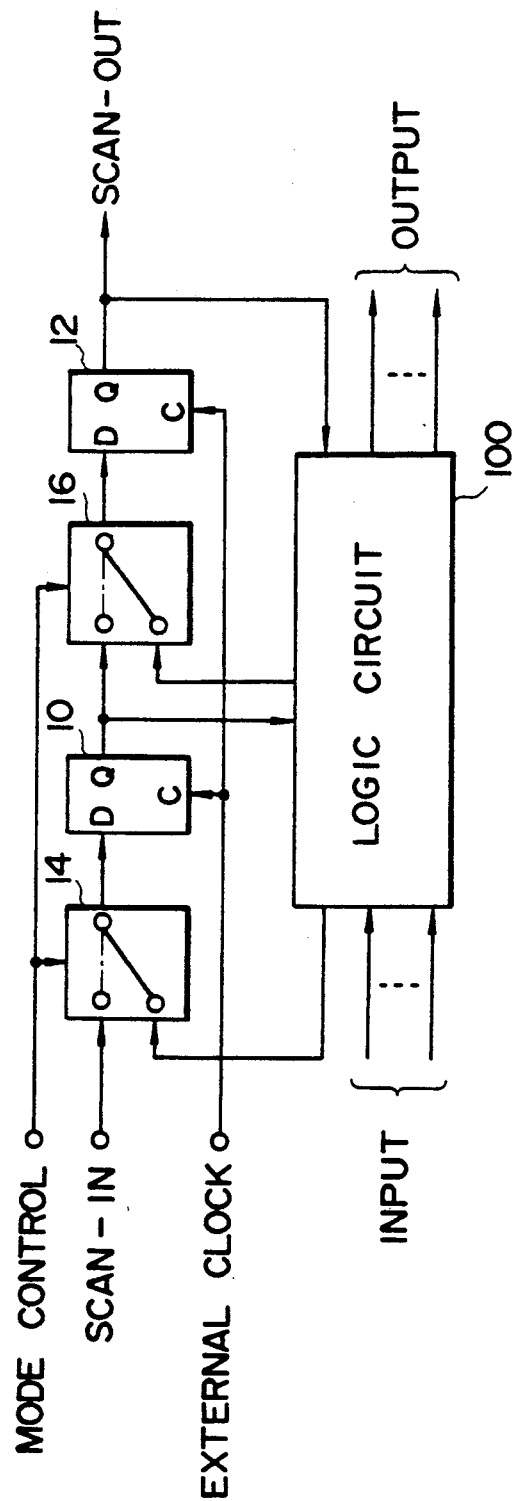
FIG. 13 is a block diagram showing one example of a conventional scan path circuit.

FIG. 12 illustrates a circuit obtained by combining the scan path circuit of FIG. 10 with the combinational circuit of FIG. 11. In this example, the scan path circuit is interposed between the AND circuit CMP17 and the inverter CMP21. The output signal S13 of the AND circuit CMP17 is therefore inputted as a signal S13' via the scan path circuit to the inverter CMP21.

A checking method will be described on the assumption that there is produced a fault wherein the signal value of the signal S13 is fixed to 0 in the combinational circuit shown in FIG. 12.

The description starts with the testing when the circuit of the invention is not used. In this case, eight signals I9 through I16 are all set to 1 so that the output of the AND circuit CMP17 becomes 1. With this arrangement, the signal S13 becomes 1, and a value of an output signal OUT is 0. The output signal OUT is then observed. If the signal value thereof is 0, this indicates a normal state. If the value is 1, however, this indicates a fault. The testing on the circuit illustrated in FIG. 12 which incorporates the scan path circuit of the invention will now be explained. For a test of the circuit, the signal S13' is set to 1, and the signal value of the output signal OUT4 is observed. A scan-in signal Sin should be set to 1 so that the signal S13' could be 1. As in the above-described embodiment, the shift operation is executed. The signal S13' is set to 1. The signal value of the output signal OUT4 is then observed. If the signal value is 0, this indicates a normal state. Whereas if the value is 1, this indicates a fault. As discussed above, the scan path circuit according to the present invention can be inserted in an arbitrary position even in the combinational circuit. As a result, the present invention exhibits such effects that the number of signal lines required for observation and setting for the testing can be reduced, and the testing is simplified in procedure.

Although the illustrative embodiments of the present invention have been described in detail with reference to the accompanying drawings, it is to be understood that the invention is not limited to those precise embodiments. As a matter of course, various changes or modification may be effected therein by one skilled in the art without departing from the scope or spirit of the invention.

What is claimed is:

1. A scan path circuit for testing a logic circuit, integrally inserted in an arbitrary place of said logic circuit, which comprises:

latch means for outputting testing data to the logic circuit and receiving the data returned from the logic circuit;

switch means connected to said latch means, for transmitting the testing data from said latch means to the logic circuit, and transmitting the returned data from the logic circuit to said latch means for scanning operation, and for directly connecting data-in with data-out of the logic circuit for normal operation, by controlling the connection of said latch means and logic circuit, thereby easily detecting faults of the logic circuit based on the data output from said latch means, said switch means including a first switch having one end connected to the data-in, a second switch having one end connected to the other end of said first switch and the other end connected to the data-out, and a third switch having one end connected to the data-out; and wherein said latch means is connected to a scan-in for inputting the testing data and to a scan-out for outputting the returned data, and said switch means has control signals for scanning and normal operations and is connected to a data-in for receiving data from the logic circuit and to a data-out for feeding out data to the logic circuit, said latch means including a first latch having an input terminal connected to the scan-in, for inputting testing data and storing the data in accordance with a predetermined control signal and having an output terminal connected to said third switch, for feeding the data through the data-out to the logic circuit, and a second latch having an input terminal connected to a connecting point between said first switch and second switch and an output terminal connected to the scan-out, for inputting the data returned from the data-in and storing the data in accordance with a predetermined control signal.

2. A scan path circuit according to claim 1, wherein said first, second and third switches are MOS transistors.

3. A scan path circuit according to claim 2, further comprising:

a first inverter for inverting and amplifying signals, interposed between said data-in and said first MOS transistor; and a second inverter for inverting and amplifying signals, interposed between said data-out and said second MOS transistor, wherein said first latch has a terminal $\overline{Q}$ connected to said third MOS transistor and said second latch has a terminal $\overline{Q}$ connected to the scan-out.

4. A scan path circuit according to claim 2, further comprising:

a first inverter for inverting and amplifying signals, interposed between the data-in and said first MOS transistor; and a second inverter for inverting and amplifying signals, interposed between the data-out and said second MOS transistor; wherein said first latch consists of a MOS transistor and an inverter and is interposed between the scan-in and said third MOS transistor, and said second latch consists of a MOS transistor and an inverter and is interposed between said first transistor and the scan-out.

5. A plurality of scan path circuits for testing logic circuits, integrally inserted in arbitrary places of said logic circuits, wherein each two of said scan path circuits comprise:

a first switch having one end connected to a data-in for receiving data of one of two logic circuits;

a second switch having one end connected to the other end of said first switch and the other end connected to a data-out for feeding out the data to the logic circuit;

a first latch having an input terminal connected to a scan-in, for inputting testing data and storing the data in accordance with a predetermined control signal;

a third switch having one end connected to an output terminal of said first latch and the other end connected to the data-out;

a second latch having an input terminal connected to a connecting point between said first switch and second switch, for inputting the data returned from the data-in, storing the data in accordance with a predetermined control signal and outputting the returned data;

a fourth switch having one end connected to a data-in for receiving data of the other of the two logic circuits;

a fifth switch having one end connected to the other end of said fourth switch and the other end connected to a data-out for feeding out the data to the other logic circuit;

a third latch, having an input terminal connected to said second latch, for inputting the output signal from said second latch and storing the data in accordance with a predetermined control signal;

a sixth switch having one end connected to an output terminal of said third latch and the other end connected to the data-out; and a fourth latch having an input terminal connected to a connecting point between said fourth switch and fifth switch, for inputting the data returned from the data-in, storing the data in accordance with said predetermined control signal and outputting the returned data through the scan-out, thereby easily detecting faults of a plurality of logic circuits based on the data outputted from the scan-out.

* * * * *